United States Patent
Kalvesten et al.

(10) Patent No.: US 9,718,674 B2
(45) Date of Patent: Aug. 1, 2017

(54) THIN CAPPING FOR MEMS DEVICES

(71) Applicant: SILEX MICROSYSTEMS AB, Jarfalla (SE)

(72) Inventors: Edvard Kalvesten, Hagersten (SE); Thorbjorn Ebefors, Huddinge (SE); Niklas Svedin, Stockholm (SE)

(73) Assignee: SILEX MICROSYSTEMS AB, Jarfalla (SE)

( * ) Notice: Subject to any disclaimer, the term of this patent is extended or adjusted under 35 U.S.C. 154(b) by 0 days.

(21) Appl. No.: 14/914,015

(22) PCT Filed: Aug. 26, 2014

(86) PCT No.: PCT/SE2014/050973
§ 371 (c)(1),
(2) Date: Feb. 24, 2016

(87) PCT Pub. No.: WO2015/030657
PCT Pub. Date: Mar. 5, 2015

(65) Prior Publication Data
US 2016/0207758 A1    Jul. 21, 2016

(30) Foreign Application Priority Data

Aug. 26, 2013 (SE) ........................................ 1350972
Aug. 27, 2013 (SE) ........................................ 1350980

(51) Int. Cl.
*H01L 23/08* (2006.01)
*B81B 7/00* (2006.01)
(Continued)

(52) U.S. Cl.
CPC .......... *B81B 7/007* (2013.01); *B81C 1/00301* (2013.01); *H01L 21/50* (2013.01);
(Continued)

(58) Field of Classification Search
CPC .......... H01L 21/50; H01L 24/94; B81B 7/007; B81C 1/00301
See application file for complete search history.

(56) References Cited

U.S. PATENT DOCUMENTS 7,230,512 B1 * 6/2007 Carpenter ................ H03H 3/08
333/133
2004/0016995 A1    1/2004 Kuo et al.
(Continued)

FOREIGN PATENT DOCUMENTS

| | | |
|---|---|---|
| EP | 1 900 680 A2 | 3/2008 |
| SE | 1 251 236 A1 | 6/2014 |
| WO | 2010/059118 A1 | 5/2010 |

OTHER PUBLICATIONS

Lai et al.: "300mm size ultra-thin glass interposer technology and high-Q embedded helical inductor (EHI) for mobile application" (IEDM) 2013, Dec. 9 to 11, 2013, in Washington, D.C. (lecture No. 13.4).
(Continued)

*Primary Examiner* — Earl Taylor
(74) *Attorney, Agent, or Firm* — Young & Thompson

(57) ABSTRACT

A device includes a base substrate (700) with a micro component (702) attached thereto. Suitably it is provided with routing elements (704) for conducting signals to and from the component (702). It also includes spacer members (706) which also can act as conducting structures for routing signals vertically. There is a capping structure (708) of a glass material, provided above the base substrate (700), bonded via the spacer members (706), preferably by eutectic bonding, wherein the capping structure (708) includes vias (710) including metal for providing electrical connection through the capping structure. The vias can be made by a stamping/pressing method entailing pressing needles under heating to soften the glass and applying pressure, to a
(Continued)

predetermined depth in the glass. However, other methods are possible, e-g- drilling, etching, blasting.

10 Claims, 14 Drawing Sheets

(51) Int. Cl.
 *H01L 21/50* (2006.01)
 *B81C 1/00* (2006.01)
 *H01L 23/00* (2006.01)
(52) U.S. Cl.
 CPC .......... *H01L 23/08* (2013.01); *B81B 2201/01* (2013.01); *B81B 2201/0264* (2013.01); *B81B 2201/0271* (2013.01); *B81B 2203/0118* (2013.01); *B81B 2203/0127* (2013.01); *B81B 2207/095* (2013.01); *B81C 2201/0153* (2013.01); *B81C 2201/036* (2013.01); *B81C 2203/0109* (2013.01); *B81C 2203/0145* (2013.01); *H01L 24/94* (2013.01); *H01L 2924/16235* (2013.01)

(56) References Cited

U.S. PATENT DOCUMENTS

| | | |
|---|---|---|
| 2004/0180517 A1 | 9/2004 | Quenzer et al. |
| 2004/0259325 A1 | 12/2004 | Gan |
| 2006/0022325 A1 | 2/2006 | Hwang et al. |
| 2006/0286798 A1 | 12/2006 | Lee et al. |
| 2008/0081398 A1 | 4/2008 | Lee et al. |
| 2012/0142144 A1 | 6/2012 | Taheri |
| 2013/0168852 A1* | 7/2013 | Liang .................. B81C 1/00293 257/737 |
| 2015/0175406 A1* | 6/2015 | Lin ........................ B81B 7/007 257/415 |
| 2015/0279756 A1 | 10/2015 | Erlesand et al. |

OTHER PUBLICATIONS

International Search Report, dated Dec. 10, 2014, from corresponding PCT application.

* cited by examiner

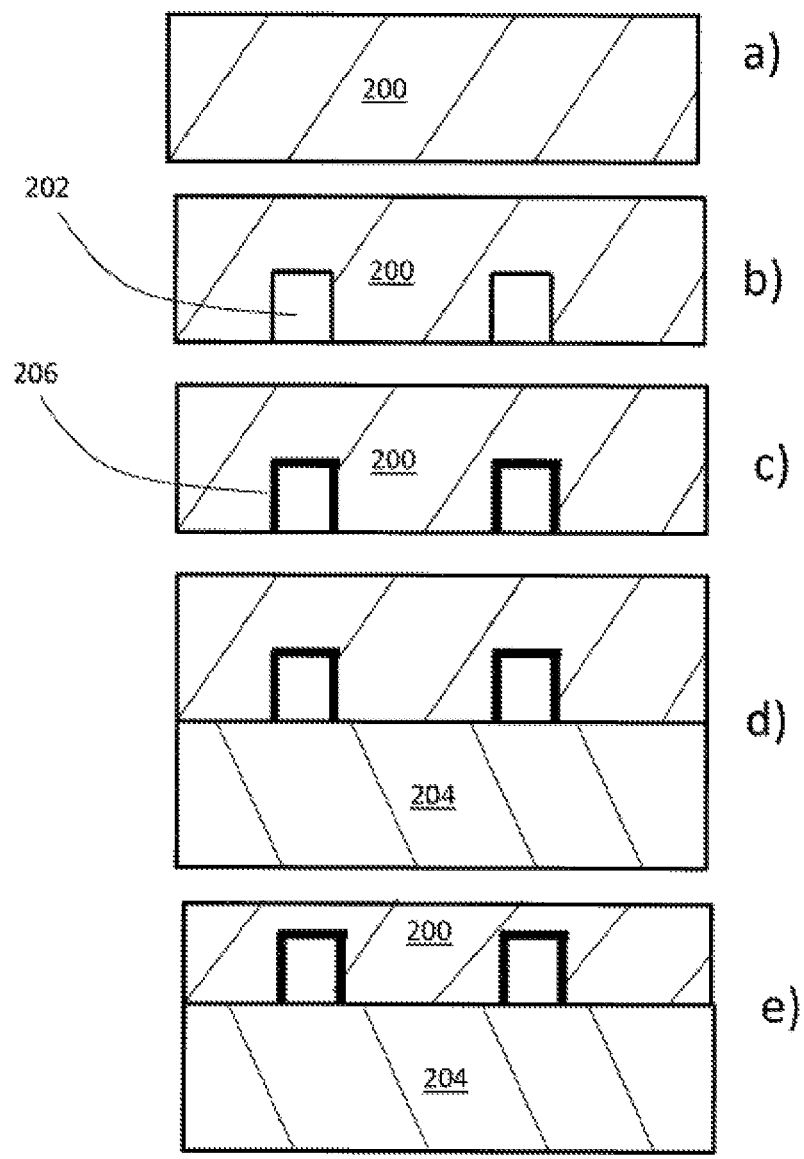
Fig. 2 a-e

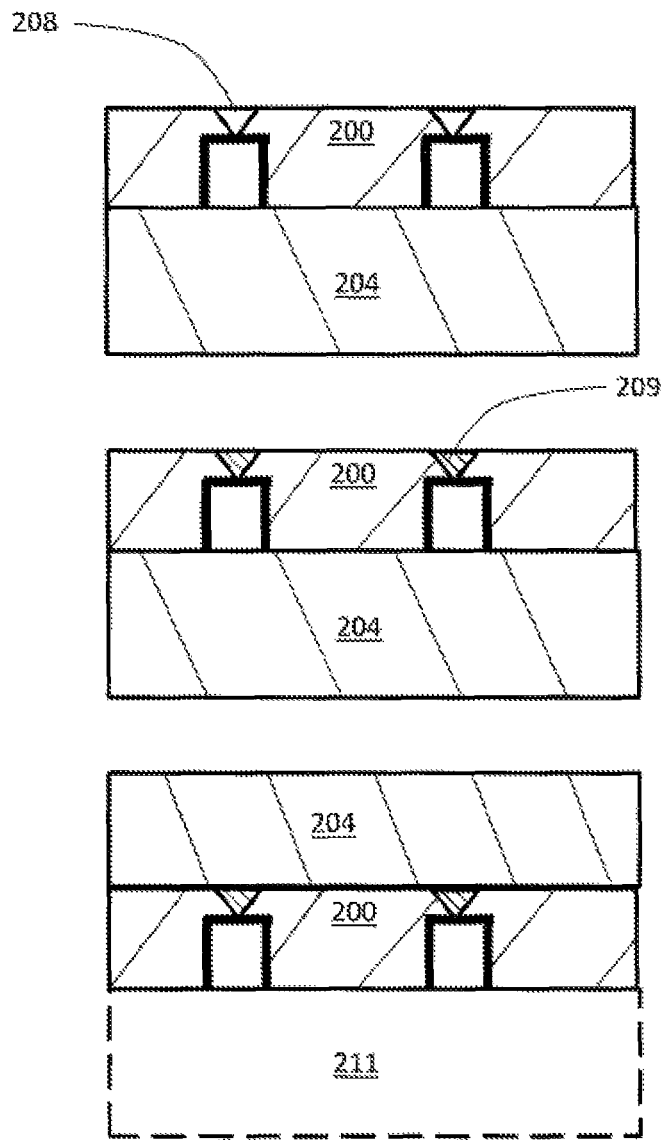
Fig. 2 f-h

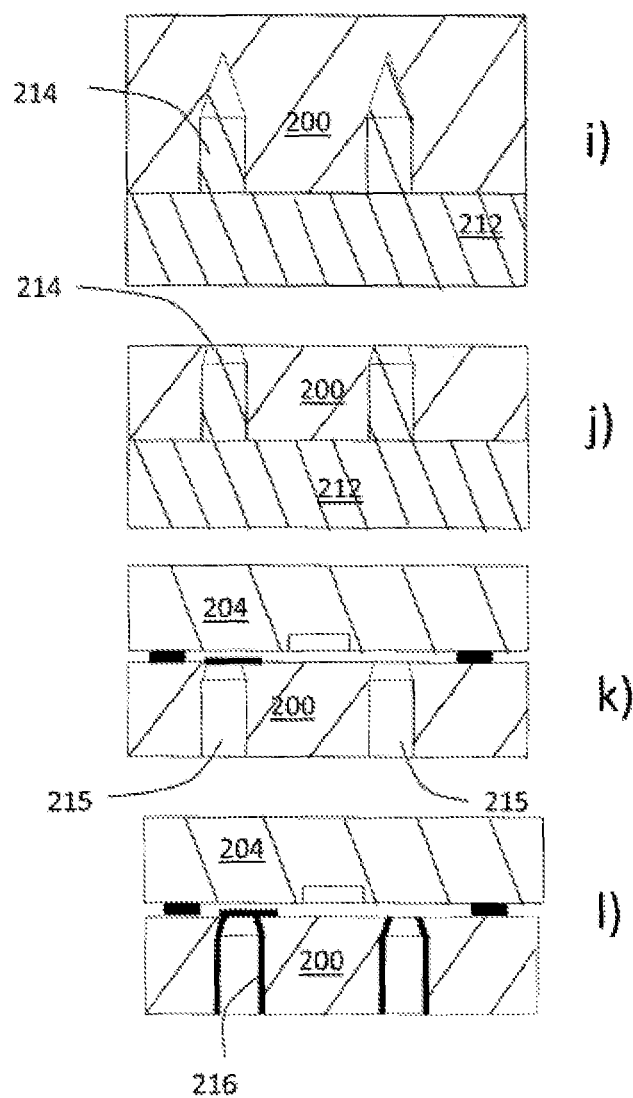
Fig. 2 i-l

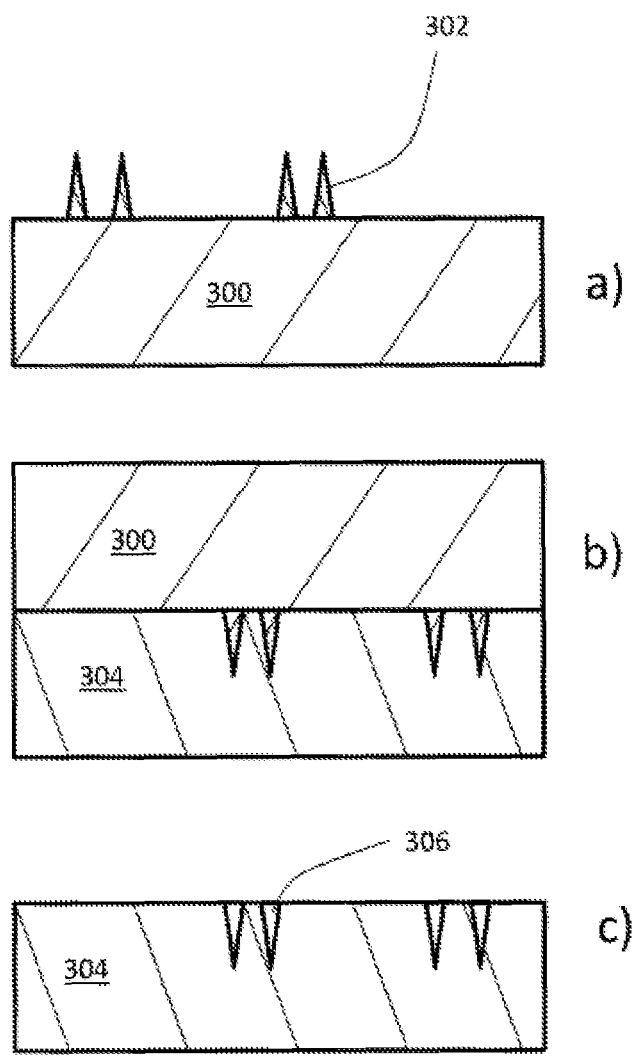
Fig. 3 a-c

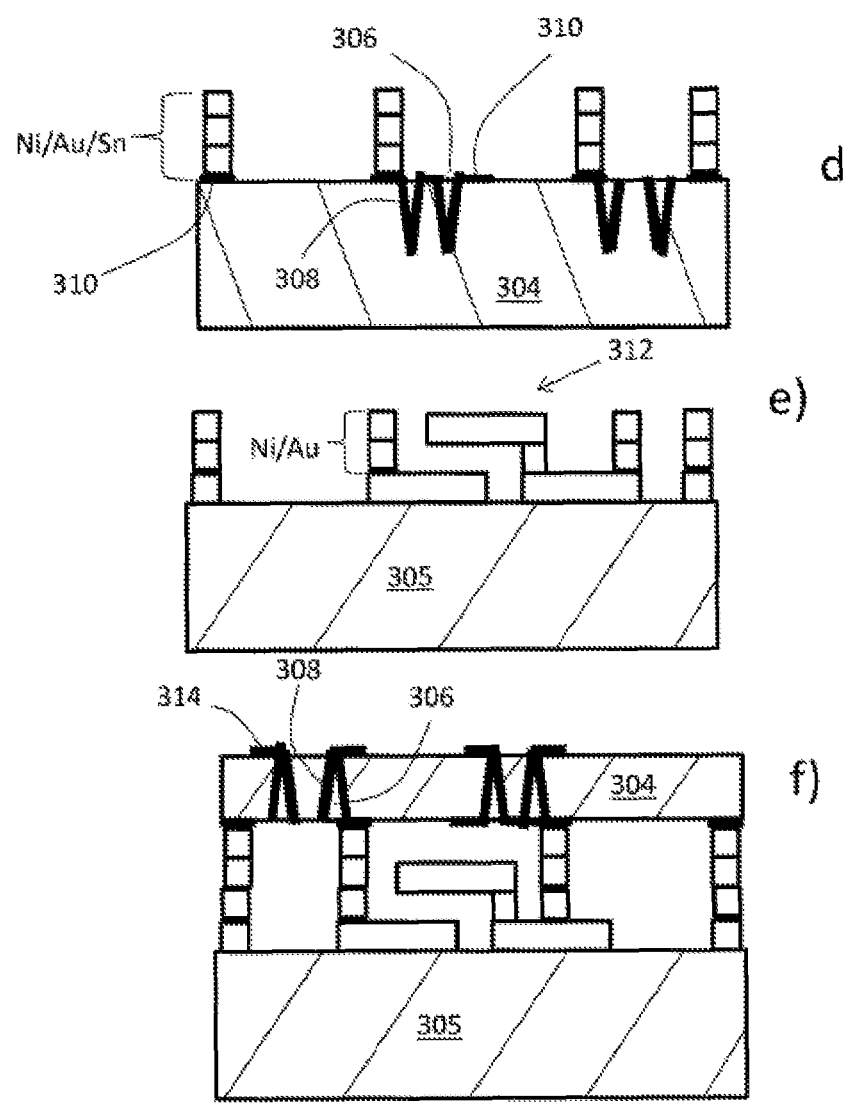
Fig. 3 d-f

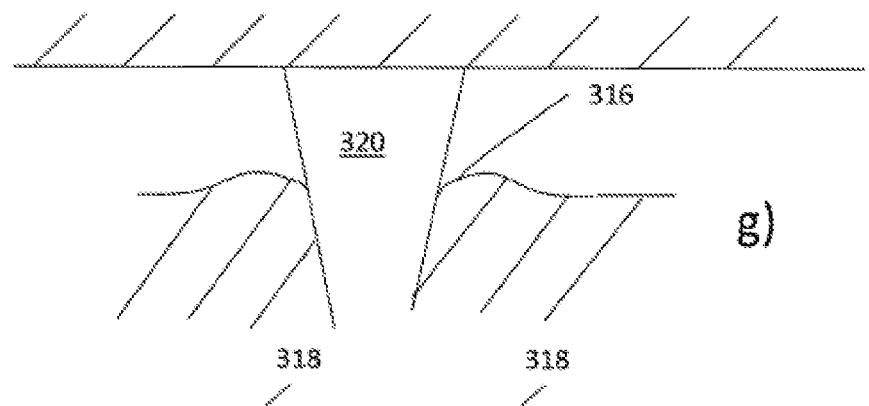
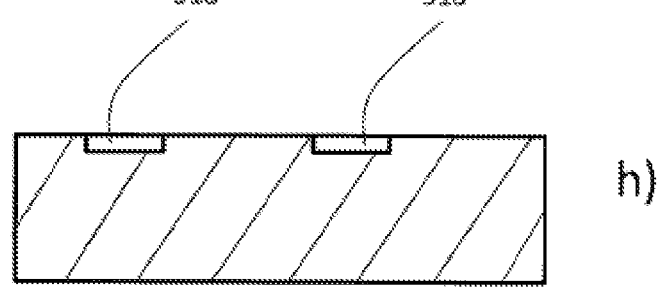
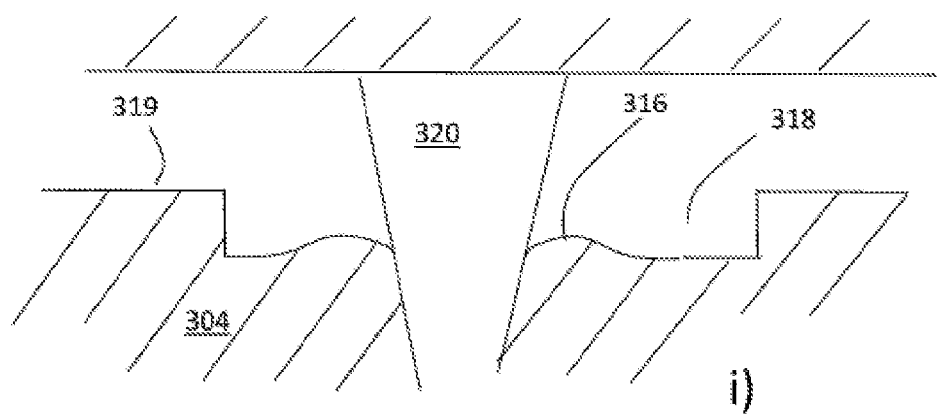
Fig. 3 g-i

THIN CAPPING FOR MEMS DEVICES

The present invention relates to MEMS engineering and in particular to providing thin capping structures made of highly resistive materials such as glass, having substrate (wafer) through inter-connects (vias).

BACKGROUND OF THE INVENTION

For RF (Radio Frequency) applications in MEMS structures and devices the dielectric properties of the support structures are of great importance, and it is desirable to eliminate "cross-talk" between neighbouring components or elements on chips or wafers on which the components in question are provided. Also the permeability constant is an important factor that controls coupling between substrate and components.

The most commonly used material for building MEMS structures and devices is silicon, which is a material having a comparatively high dielectric constant.

However, most often the silicon is doped in order to increase conductivity and thus, the conductivity will contribute to negative effects, such as increased losses and non-linearity effects.

Stray capacitances are the most important negative factor in both RF applications and in capacitive measurements, and traditional silicon processing will inherently cause such problems.

PRIOR ART

Applicants own Swedish patent application No. 1251236-4 relates to a method of making metal vias in a glass substrate.

Taiwan Semiconductor Manufacturing Company has presented a method of making a glass interposer having metallized vias at International Electron Devices Meeting (IEDM) 2013, Dec. 9 to 11, 2013, in Washington, D.C. (lecture number: 13.4).

SUMMARY OF THE INVENTION

In view of the drawbacks in using silicon in the above discussed applications, the inventor has devised a new structure based on highly resistive materials, such as glass, as the base material for the structure, and methods for making the necessary features of the new structure. The advantage of the method according to the invention is that the cap can be made very thin.

Specifically, there is disclosed a method of making a micro-device with a capping structure, comprising the steps of providing a base substrate on which there is a micro-electronic and/or micro-mechanic component attached or integrated; providing a cap substrate of a glass material, i.e. a non-crystalline (i.e. amorphous) material and that exhibits a glass transition when heated towards the liquid state, preferably a material selected from borofloat glasses, quartz, metallic alloys, ionic melts, AlOx, and polymers; making micro-depressions in said cap substrate to a predetermined depth; metallizing the depressions in the cap substrate; providing electrical connection through the cap substrate; bonding together the base substrate and the cap substrate, such that there is an electrical contact between the component on the base substrate and the metallized depressions in the cap substrate. The material in the cap wafer should gave a CTE (Coefficient of Thermal Expansion) matching the other wafer, in order to avoid thermal mis-match and mechanical stress issues.

The base substrate is suitably bonded to the cap substrate on the side where optionally the micro-depressions are made, after the metallization of the micro-depressions, but before the electrical connection through the cap substrate is made. Alternatively, the base substrate is bonded to the cap substrate on the side opposite from where the micro-depressions are made, after the metallization of the micro-depressions, and after the electrical connection through the cap substrate is made.

The provision of electrical connections preferably comprises thinning the cap substrate on the opposite side from where the micro-depressions are made and exposing the metal in the micro-depressions. The thinning can be stopped before the metal is exposed and making openings to expose the metal, and metallizing the openings to provide contact and to hermetically seal the through connection.

The method suitably also comprises making the micro-depressions by stamping or pressing a plurality of needles protruding from a support wafer, into the glass wafer under heating and pressure. The needles are removed together with their support wafer immediately after the depressions are made so as to leave holes in the glass. Alternatively, the metal/metallized needles are left in the glass material after the depressions and only the support wafer is removed so as to leave metal filled or partly filled holes in the glass.

There is also disclosed a device comprising a base substrate with a micro component attached thereto; routing elements for conducting signals to and from said component; spacer members which also can act as conducting structures for routing signals vertically; a capping structure of a glass material, provided above the base substrate, bonded via said spacer members, preferably by TC (Thermo Compression) or eutectic bonding, wherein the capping structure comprises vias comprising metal for providing electrical connection through said capping structure. The component is preferably a MEMS or CMOS component.

Further embodiments are defined in the dependent claims.

BRIEF DESCRIPTION OF THE DRAWINGS

FIG. 2a-l illustrates different embodiments of a process sequence;

FIG. 3a-c illustrates a method of making micro-depressions;

FIG. 3d-f illustrates process steps for finishing a device;

FIG. 3g-i illustrates an embodiment of the process shown in FIG. 3a-c;

DETAILED DESCRIPTION OF PREFERRED EMBODIMENTS

For the purpose of this application and invention the term "glass" should be interpreted broadly, and is defined in a wide sense, including beside traditional silica glasses, every solid that possesses a non-crystalline (i.e. amorphous) structure and that exhibits a glass transition when heated towards the liquid state. In this wider sense, glasses can be made of quite different classes of materials: borofloat glasses, quartz, metallic alloys, $AlO_x$, and polymers.

Also, when the term "substrate" is used it should be taken to encompass entire wafers, as the term is known in the semiconductor industry, as well as other kinds of structures of different sizes that can be processed as described herein.

For certain aspects and applications so called borofloat glasses are suitable, for other applications quartz materials are preferred.

An important property of the material for RF applications is that it be highly resistive and that it exhibits a low dielectric constant.

Figure 1:
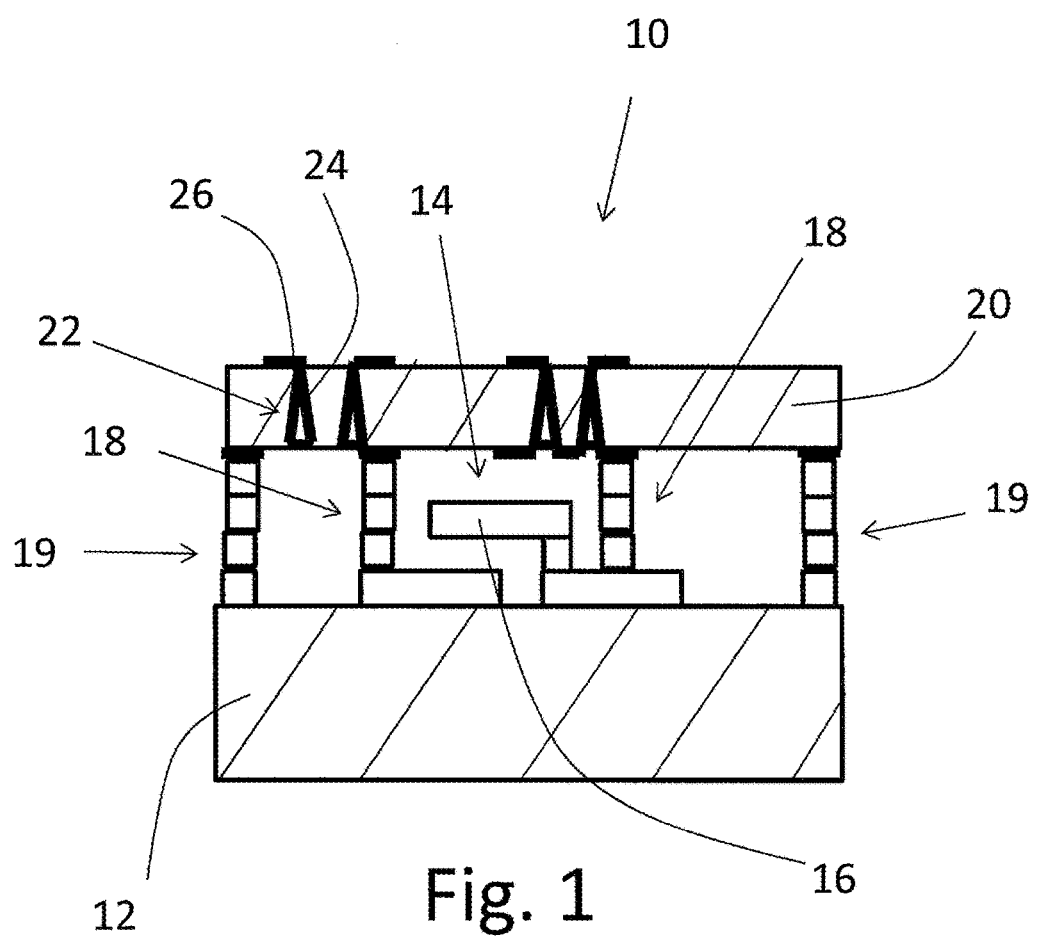
FIG. 1 shows an example of a structure obtainable with the disclosed methods.

In FIG. 1 there is shown (not to scale) an embodiment of a device made in accordance with the invention, namely a MEMS device 10 comprising a substrate 12 on which there is provided a component 14 with a free hanging or cantilevering element, or a membrane, i.e. having a movable member 16, which could be e.g. an RF switch, a resonator, an inertial sensor or a pressure sensing element. The component 14 is enclosed in a cavity which depending on the application can have an atmosphere in the form of a vacuum, or an inert gas at a selected pressure. The enclosure is formed by a metal bonding technique such as eutectic bonding, soldering or thermo compression, where a bond 19 is formed as a closed loop encircling the component 14 in question, thereby forming a vacuum tight seal.

There are further bonding structures 18 shown which form substrate-to-substrate electrical interconnects and which also can act as support structures and/or spacer structures for the device.

The capping structure 20 is a glass substrate (wafer) (as defined herein above) having electrical through connections 22, referred to as vias herein, essentially being recesses or holes extending through the glass substrate. Examples of the fabrication of these vias will be disclosed in detail below. The vias have a metal coating 24 on the inner walls thereof which is connected to fan in/fan out wires to contact pads 26 on the upper surface (as seen in the figure) of the glass substrate 20.

The thickness of the final capping substrate structure as shown can be as low as 30 µm although 50-100 µm is preferred, which hitherto has been unattainable in the prior art.

In general, a device made according to the invention comprises the provision of a capping substrate having through connections referred to as vias. The vias themselves can be made in several ways, and the methods for making vias are not part of the inventive concept as such although some of the methods are regarded as inventive per se.

Thus, in FIG. 2a-h the method in its more general aspect is illustrated showing embodiments in the figures (the figures are shown as cross-sections through the structures). In these figures no cavities for accommodating components are shown for simplicity, but it should be understood that such cavities are often required, and embodiments showing such cavities are described below.

A substrate, suitably a wafer, 200 of a glass material (as defined herein above) is provided, for making a cap, FIG. 2a.

Holes 202 (in a general sense, they need not be circular and could in principle even be elongated grooves) are made in the glass substrate by any suitable method, FIG. 2b, such as drilling, blasting, milling, etching, laser treatment, pressing needles into a substrate, or combinations of these methods.

The walls in the holes are metallized 206 by any suitable method such as plating, ink-jet printing, evaporation, sputtering or a combination of these methods, see FIG. 2c. Plating is not discussed herein since it pertains to the field of the skilled man.

Now there are two options available for the continued processing.

The first option is to provide a component substrate 204, FIG. 2d, (semiconductor wafer with some MEMS structure, the latter not shown) which is bonded to the glass such that there is provided contact between the components and the metallized vias, if required by the provision of suitable routing structures (not shown). Then the cap substrate 200 is thinned down from the opposite side of where the vias were made, e.g. by grinding, etching, lapping or combinations thereof, FIG. 2e.

Again, within this option, two further options exist— either the glass cap substrate can be thinned down further than shown in FIG. 2e, such as to reveal the metal in the bottom of the vias (not shown), or, as shown, the grinding stops a distance above the vias, FIG. 2e. Then, etching (wet or dry) or milling is performed locally at the positions of the vias to provide small openings 208 to expose the metal, FIG. 2f. In the drawing these openings are shown as "funnel" structures, i.e. tapered or sloped, but they could also be provided as holes with essentially vertical side walls. These openings are metallized, and preferably filled with metal 209, FIG. 2g so as to provide a hermetic seal. However, it would suffice to just coat the side walls of the openings. Thereafter, or in the same step in which the holes 208 are metallized, contacts can be made for routing etc. but this is not part of the invention per se and will not be described further here. However, in connection with preferred embodiments this is elaborated on in some detail.

Figure 5:
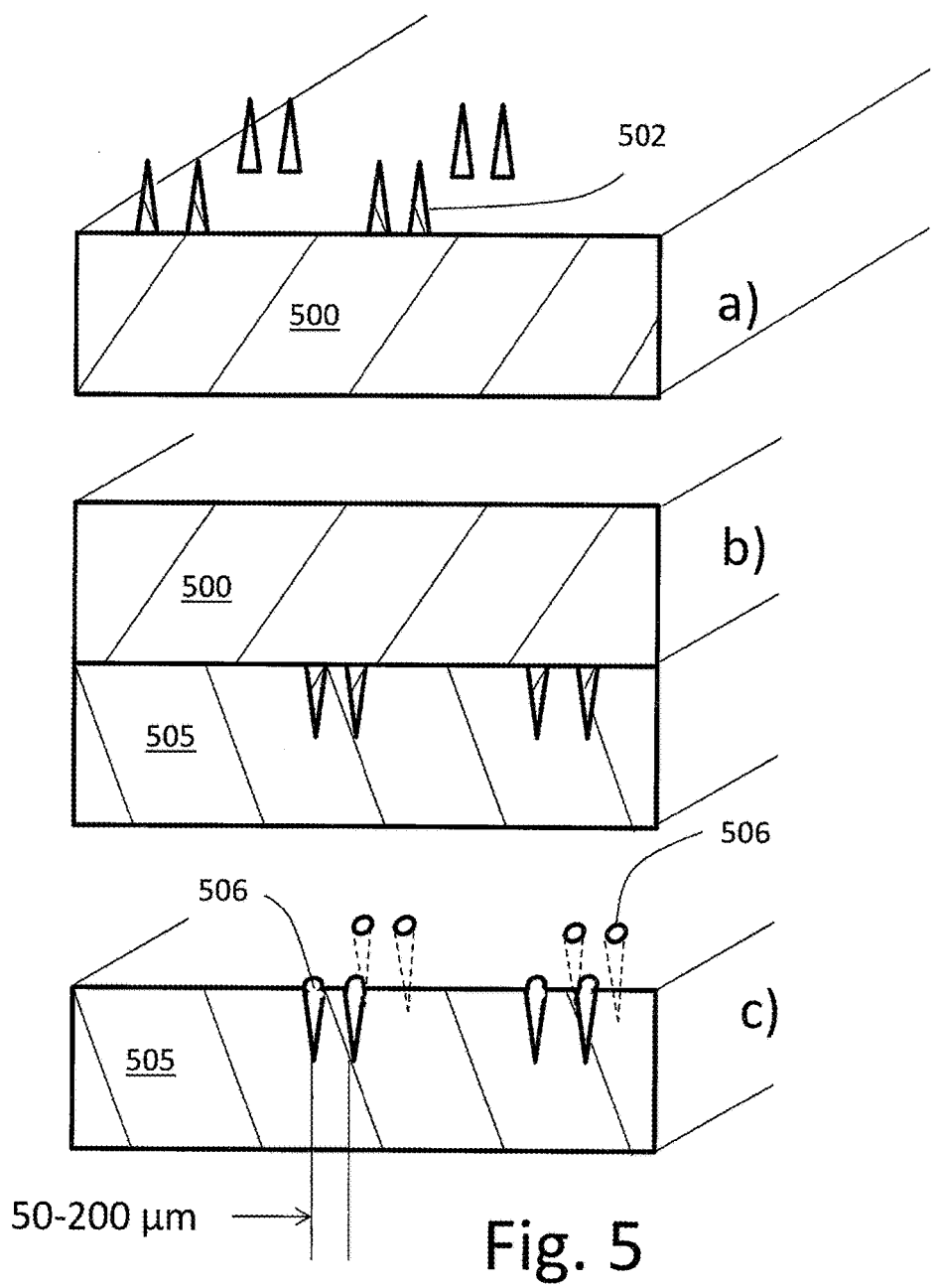
FIG. 5a-c shows a further embodiment of the method of making micro-depressions.

The process of making the openings 208 is described in some further detail below in connection with a specific embodiment, FIG. 5.

As mentioned, alternatively the thinning can be made all the way down to the metal in the vias, which requires that the depth of the vias are very accurately defined, which can be difficult to achieve.

Going back to the alternative after the step in FIG. 2c, i.e. the bonding of the component substrate 204 to the cap substrate 200, instead of bonding the component substrate to the cap after the holes have been metallized, the bonding could be made after the vias have been completed as described above, FIG. 2h. However, in such case it would require a temporary carrier wafer 211 for handling purposes.

In one embodiment for making the holes by using needles (to be described below) this temporary carrier will be automatically be provided by the process. Otherwise, if e.g. drilling or etching is used for making the holes, a real temporary carrier 211, as shown in FIG. 2h, would have to be attached to the cap substrate. This is possible but not preferred since it adds processing steps to the method which is not economical.

In a still further embodiment a stamping or pressing procedure using needles is used for providing the cap substrate with vias, schematically illustrated in FIGS. 2i-l.

Thus, as shown in FIG. 2i a needle matrix comprising a plurality of needles 214 on a substrate 212, acting as a temporary carrier, is used. Preferably the needles are made of silicon or metal or a combination of metal and silicon on a silicon wafer. Methods for making such needles are known and will not be discussed herein. A substrate 200 of a glass material is heated so as to soften and the needles 214 are pressed into the glass material, FIG. 2i. Next, the glass substrate 200 is grinded so as to expose the silicon of the needles. Suitably a part of the needle tips are also grinded away to leave a structure as shown in FIG. 2j.

Now a component MEMS or semiconductor substrate 200 is bonded to the cap substrate 204. After bonding of the component substrate 204 the silicon material, i.e. the substrate 200 with its needles 214 is etched away leaving a structure shown in FIG. 2k, i.e. a MEMS substrate 204 with a cap 200 having empty via holes 215.

In the next step, FIG. 2l, the via holes 215 are metallized by suitable methods, e.g. plating to provide a metal coating 216 inside the via holes on the walls. In this manner electrical connection is ascertained through the cap 200.

In an alternative embodiment the needles 214 can be metallized before the matrix is pressed into the glass substrate (not shown). Thus, the metal on the needles will remain in the holes when the silicon is selectively etched away after the needles have been pressed into the glass substrate. In this embodiment then no separate metallization of the via holes will be required.

However, the end result will be identical to the structure in FIG. 2l.

Alternatively, only the needle carrier material is etched away and the needles themselves remain in the holes (not shown). This can be advantageous from a processing point of view since the resulting wafer is essentially planar, and there are no voids which could cause processing issues.

One embodiment of the method according to the invention for making a device is described with reference to the process sequence illustrated in FIGS. 3a-f employing the needle based method for making holes. The component made is an RF switch, but of course the general aspect of the method is not limited thereto.

In FIG. 3a a silicon substrate 300 is provided, in or on which there are formed sharp and essentially conical, 70-100 μm high silicon needles 302, made by DRIE and or KOH etching, or pure metal needles fabricated by plating, the result being a carrier 300 with needles 302 protruding there from. The needles can be structured in several ways using e.g. KOH etching, DRIE etching or by electroplating of metal in silicon or polymer mold structures defining the needles.

A glass substrate 304, thickness a 300-500 μm is provided having suitable softening properties at elevated temperatures, and the needles are pressed or stamped into this glass substrate at a temperature of about 650° C. and under a force (>10 kN), see FIG. 3b. The glass can be so called borofloat glass (boron and phosphorus based with ions such as Na and the like), obtained from Planoptik, Schoot, Corning, Hoya and others, under trade names Borofloat®, Pyrex® etc.

When the needles have been pressed down in the glass the carrier can be removed simply by breaking off, and then the needles 302 remaining in the glass are etched away. Possibly the entire structure, i.e. substrate and needles, is etched away.

If a stamping method is used the needles are just pressed into the glass and thereafter directly separated from the glass in the same process, thereby leaving depressions 306 in the glass. Thereby there is no need to remove any residual silicon in a following process step.

If silicon needs to be removed this is suitably done by TMAH/KOH/grinding/lapping or combinations thereof to yield a structure as the one shown in FIG. 3c.

Next, as shown in FIG. 3d, metal 308, e.g. Cu or Au, is plated on the walls in the depressions 306 by providing a plating mask using suitable lithography (not shown), and contact pads 310 are also suitably provided in the same plating step. There is also provided a metal structure for providing a bond and sealing frame and electrical contact. The metal could be tin (Sn) based solder alloys, e.g. AuSn, CuSn etc., or pure metals, e.g. Au, Cu, Al etc., for TC bond, or combinations of these.

The structure shown in FIG. 3d is an intermediate structure 307 that eventually will form the capping structure of the finished product.

Next, see FIG. 3e, a MEMS component exemplified by an RF switch 312 is built on a component substrate 305, suitably made of silicon or glass, the details of which are not discussed since this component is only exemplary and state of the art.

Ni/Au pads for contact and seal ring are also made with methods well known to the skilled man. The structure in FIG. 3e is referred to as a functional component structure.

The intermediate capping structure from FIG. 3d is flipped over and positioned in alignment with well known alignment techniques over the functional component structure from FIG. 3e.

Using heat and pressure the two structures are bonded together by eutectic or TC bonds, or combinations of these, by virtue of the bonding materials provided on each structure.

However, as already indicated above, it should be noted that other bonding methods such as thermo compression or soldering can be used as well. Such methods are described in applicants own WO 2010/059118, which is incorporated herein in its entirety.

Briefly, typically bonding of the capping structure to another substrate is achieved by thermo compression, or soldering, and bond pads must be provided.

In particular it is also required that there be provided sealing structures so as to enable the capping to provide a hermetic sealing of components inside the capping.

To achieve this, the wafer is covered with a resist film on the front side applied by for example lamination, and holes and areas are opened up to provide a mask defining the bond pads/bonding/sealing structures. Then, stacked metal layer structures are applied through the mask by e.g. electroplating. Suitably the structure is made up of a first layer of Ni, a second layer of Au and a final layer of Sn, but also other solder alloys such as AgSn, CuSn, AgCuSn, PbSn to mention a few, are possible.

By the method disclosed above a hermetic seal of the wafer through via is ascertained.

The glass substrate 304 is thinned down by grinding and/or etching to expose the metal 308 in the depressions 306. By suitable masking and plating further contacts 314 are provided on the glass capping, forming a structure as shown in FIG. 3f with a sealed cavity having a glass capping with metal vias and excellent properties for RF applications.

Figure 4:
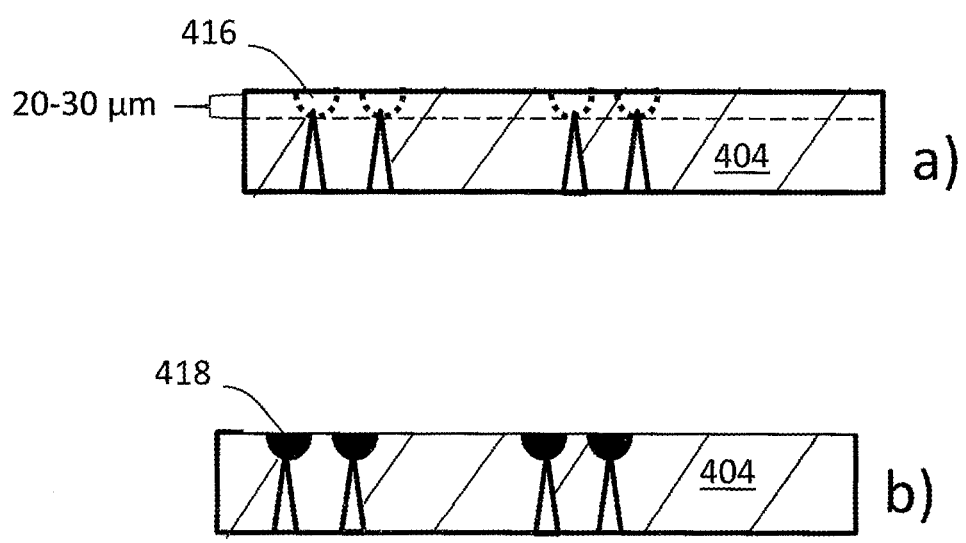
FIG. 4a-b illustrates an embodiment of how to provide vias.

However, in general it is very difficult to control the depth of the vias, and consequently the grinding to expose the metal, as described above, is not always possible since some vias will be exposed before others. Therefore, alternatively the glass can be thinned down only to the extent that 10-30 μm of the glass material is left above the vias, see FIG. 4a. Then contact holes 416 are opened by grinding and/or wet HF etching, and the thus formed depressions are metallized to form the contact pads 418, FIG. 4b. This latter process is not specific to the above embodiment but can be used in any embodiment of the general method described herein.

In the process of making the depressions by pressing needles into the glass material, as in FIGS. 3a-c, the displaced material will inevitably have to go somewhere, and what happens is that the surface of the substrate will "bulge" 316 slightly around the holes that are being created by a needle 320. This is illustrated in FIG. 3g, but is not to scale.

This effect may cause problem in subsequent processing, such as the metallizing and bonding steps to follow where planarity is a desired property. Therefore, in preferred embodiments, the substrate is pre-processed to provide recesses 318 in the substrate, see FIG. 3h. These recesses will accommodate the bulging when the needles are pressed into the substrate material, and thus the planarity of the substrate is ascertained, at least to a sufficient degree, since the bulging material will not extend above the field, i.e. the surrounding substrate surface 319.

This is illustrated in FIG. 3i, which is a magnification of a portion of a substrate and its recess 318, showing a needle 320 during the process of pressing it into the substrate 304 within the boundaries of a recess 318 such that the displaced material is confined in the recess and does not extend above the "field surface" 319 of the substrate.

As an alternative to the stamping or pressing methods described above, the holes can also be made using other techniques, in particular where the material in the capping structure (for example quartz and alkali free glass) is not so easily softened by heating as the traditional glass materials.

Lithography, i.e. masking end etching are standard methods in MEMS and semi-conductor engineering, and the skilled man would be able to design appropriate set-ups for creating holes in selected capping substrate materials, the holes having the desired dimensions (diameter, depth, pitch) to suit the present invention.

Blasting, milling, (laser) drilling and EDM (Electro Discharge Machining) techniques are also possible to employ.

Figure 6A:
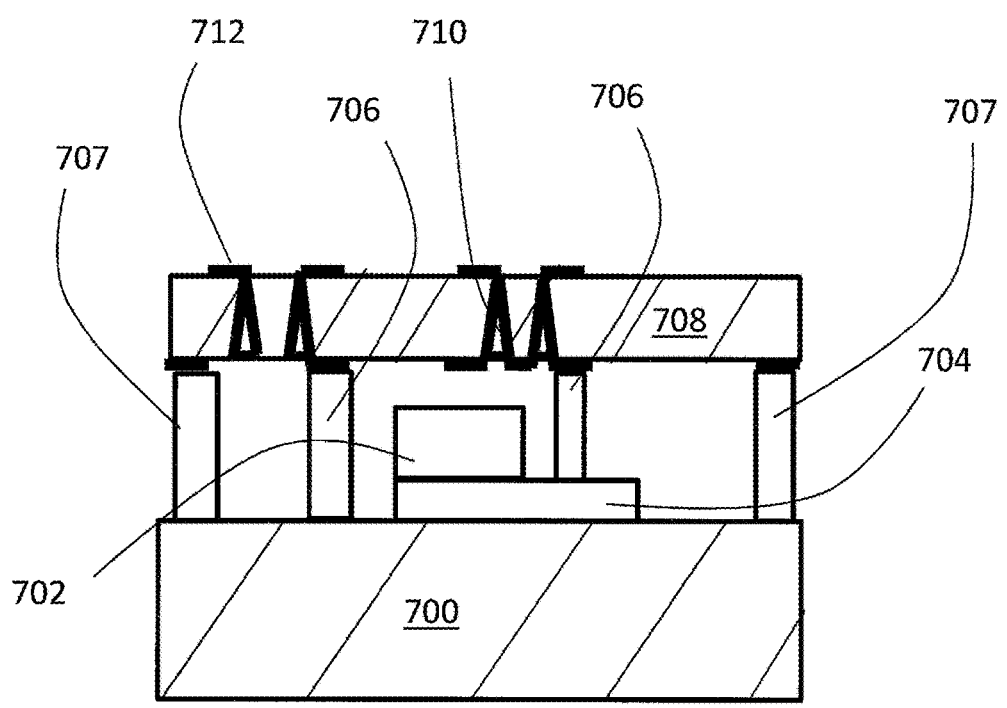
FIG. 6a is generalized representation of a device.

FIG. 6a is a schematic representation of a structure incorporating a glass capping with metal vias. It is a generalization of the structure shown in FIG. 1.

Thus, generally a device can comprise a base substrate 700 with some component 702, e.g. MEMS or CMOS component, attached thereto. There are routing elements 704 for conducting signals to and from said component 702. Inner and outer spacer members 706, 707, respectively, are provided which also can act as conducting structures for routing signals vertically. Suitably the outer spacer members 707 form an enclosure for sealing purposes, i.e. they form a closed loop around the component 702, and the inner spacer members 706 serve for electrical connection, and can therefore be provided in form of pillars or the like. Above the base substrate 700 there is provided a capping structure 708 of glass, bonded via said spacer members 706, 707 preferably by eutectic bonding, as discussed above.

The spacers 706, 707 provide a finite and well defined distance between base substrate and capping.

Some of the spacers can be actual rigid elements that defines a predetermined height. Other members, as indicated above suitably the outer members 707, can be used as sealing elements in which case they surround the component 702 to form a sealed cavity, and need not necessarily be rigid themselves, but then rely on other spacers to define the height.

The capping structure 708 comprises vias 710 comprising metal for providing electrical connection through said capping structure, and contact pads 712 connected to the metal in the vias.

Figure 6B:
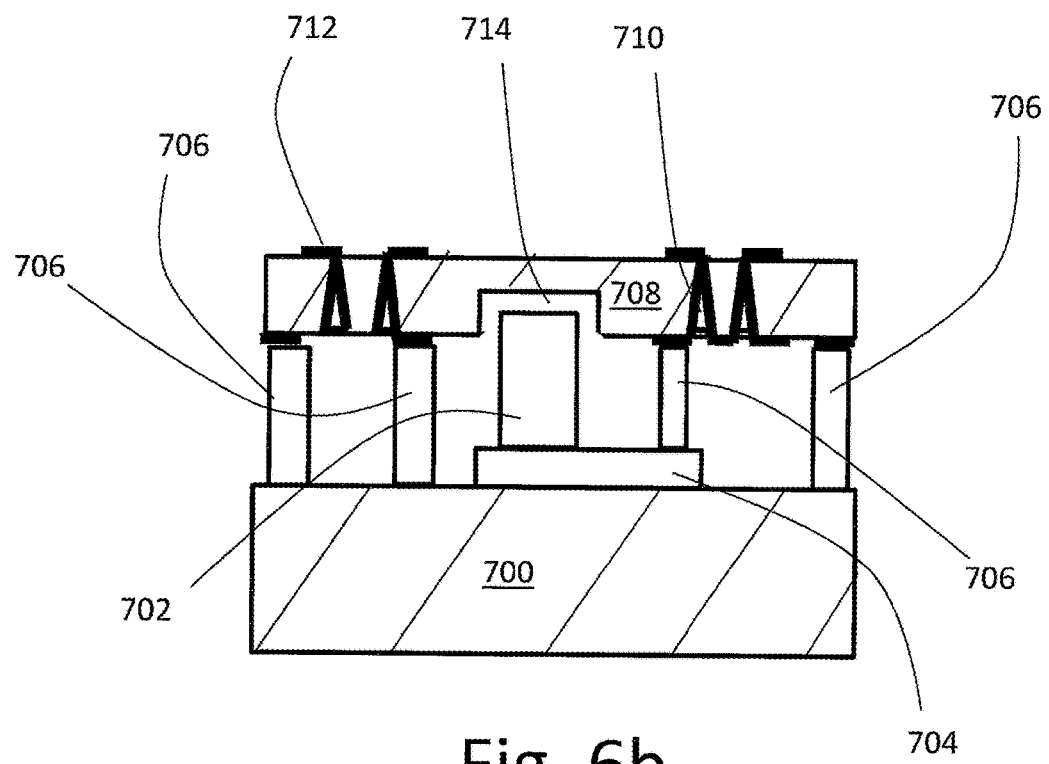
FIG. 6b is an embodiment wherein the cap comprises a recess for providing accommodation of a component.

In FIG. 6b a further embodiment of the structure shown in FIG. 6a is illustrated. Here, the component 702 has a height such that the spacer members 706 are not sufficiently long to accommodate the component between substrates. Therefore a recess 714 is made in the cap 708. This recess provides enough space for the component 702, e.g. if it comprises a movable member that moves in the vertical direction.

Figure 7:
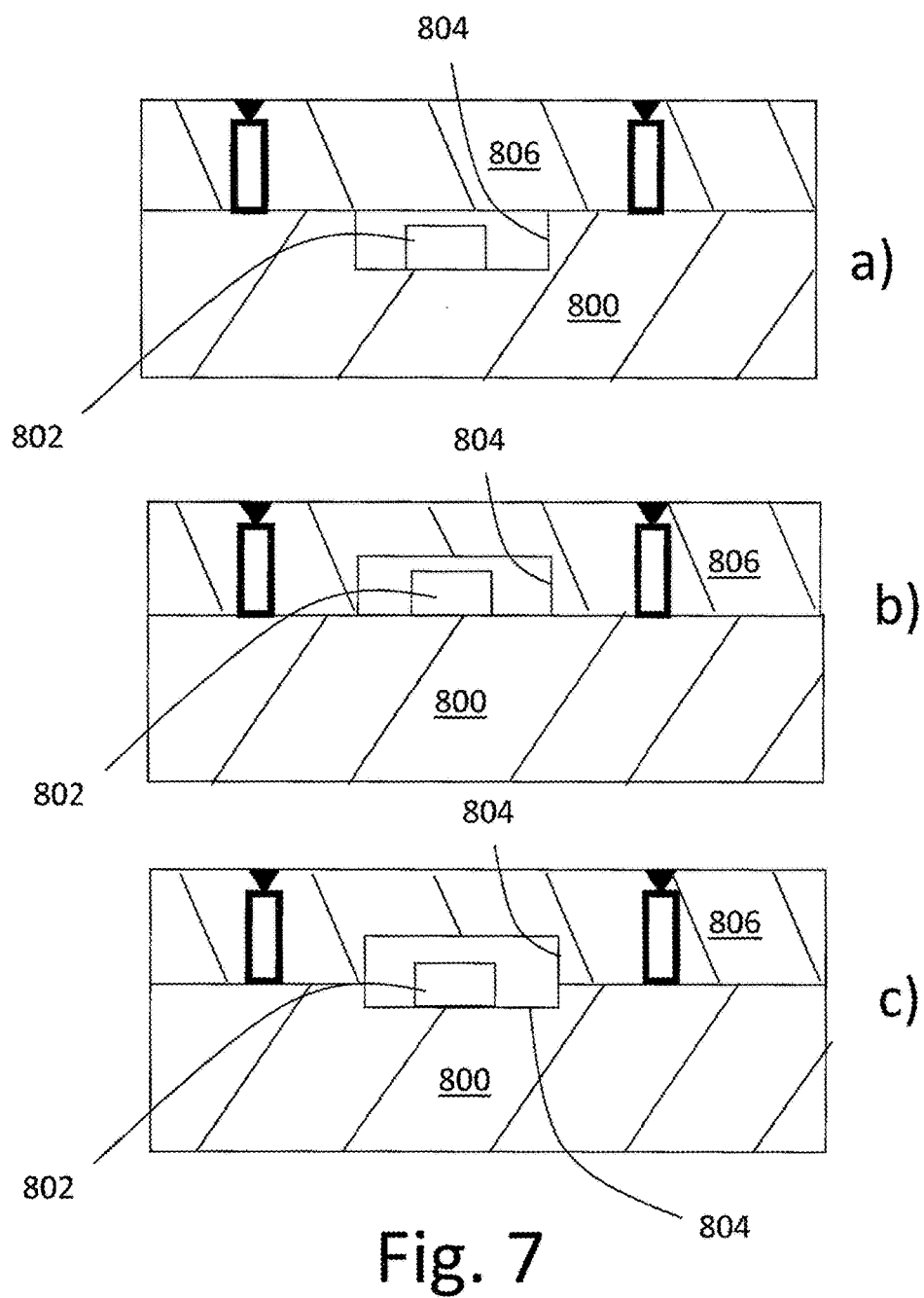
FIG. 7a-c shows alternative embodiments for providing cavities to accommodate components.

This feature, i.e. of providing recesses in the substrates is usable in all embodiments of the present invention, and the recess can be provided in the base substrate, in the cap substrate or in both, which is illustrated in FIG. 7.

Thus, in FIG. 7a a base substrate 800 has a component 802 located in a recess 804 in the base substrate, and a cap 806 is bonded to provide a sealed cavity.

In FIG. 7b (same reference numerals as in FIG. 7a are used), the recess 804 is provided in the cap substrate 806, and in FIG. 7c there are provided recesses 804 in both substrates 800 and 806.

The components 802 can be integrated or discrete components, both MEMS and CMOS structures (mechanical, electrical (IC), optical (laser, LED etc.).

In a further embodiment, there is provided a feature that simplifies processing.

Namely, the glass capping being extremely thin in the finished structure, it will be difficult to process it further. For example the provision of contact pads and/or redistribution layers (RDL) requires lithography, etching etcetera, which exposes the structure to great risk of being damaged. It would be beneficial to be able to refrain from post processing of this kind.

Figure 8:
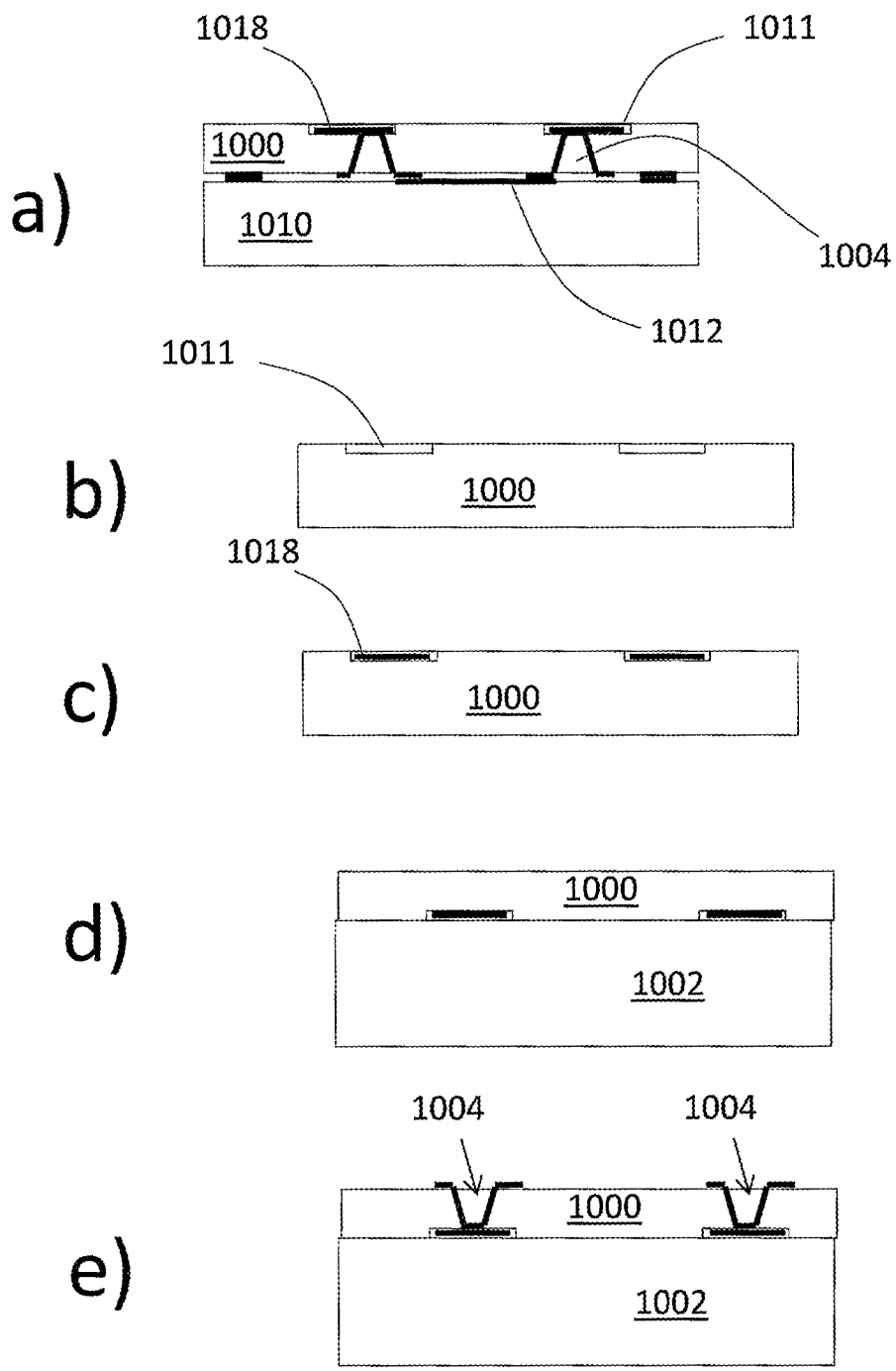
FIG. 8a-e illustrates a process sequence for an specific embodiment for making recessed contact pads.

Therefore, the invention provides a method for making such contacts/RDLs before the glass via wafer is bonded to the component wafer, whereby the contact pads will be recessed in the final product. This will now be described with reference to FIG. 8.

As can be seen in FIG. 8a, which shows a structure as the end result of the process in FIGS. 8b to 8e, i.e. a glass via wafer 1000 joined to a component wafer 1010, the contact pads/RDLs 1018 are provided in a depression or groove 1011, such that they do not extend above the surface of the wafer.

In fact, the pads/RDLs 1018 are made before even a carrier wafer 1002 is attached to the glass wafer 1000 and before the vias are made. This will now be described with reference to FIGS. 8b-e.

Thus, a glass wafer 1000 is masked and etched to provide depressions 1011, as shown in FIG. 8b.

Again suitable masking is made and the bottoms of the depressions are electroplated to provide the desired metal contacts 1018.

Now the glass wafer 1000 is bonded to a carrier wafer 1002 as shown in FIG. 8d, and the glass is thinned down. By a similar process as described in FIG. 7 vias 1004 are made in the glass wafer, as shown in FIG. 8e.

Now the component wafer is bonded to the structure in FIG. 8e and when the carrier finally is removed the pads 1018 are revealed and the final structure (FIG. 8a) is obtained, having the pads/RDLs recessed so as to not extend above the surface.

One embodiment of the invention will be now described in the form of an example.

EXAMPLE

Figure 9:
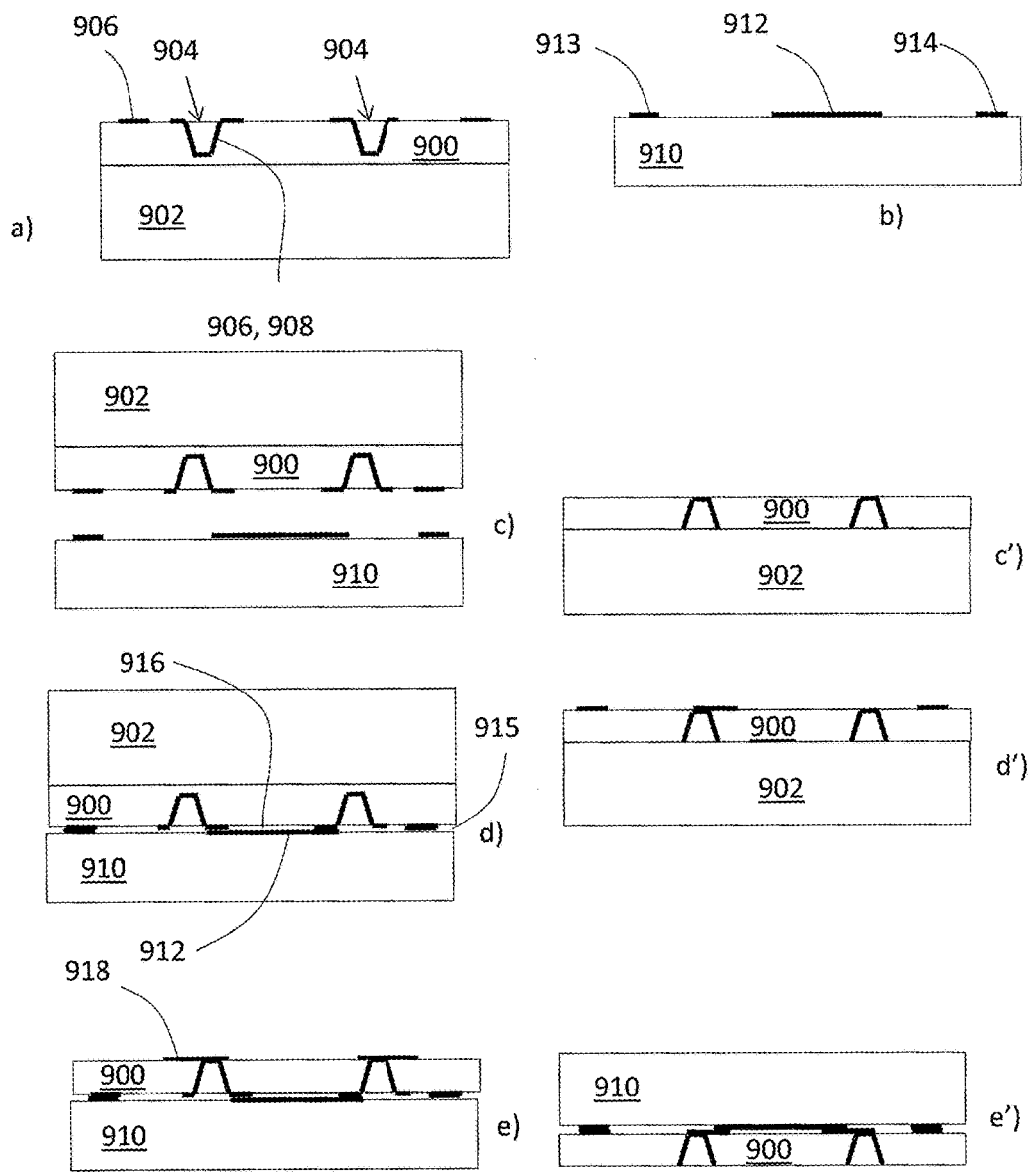
FIG. 9a-e' illustrates the process sequences described in the EXAMPLE.

FIG. 9 shows a process sequence for making MEMS device having a capping structure of glass with TGVs (Through Glass Vias).

A glass wafer 900 is bonded to a carrier wafer of silicon 902. The glass wafer could be a standard glass wafer, typically 400-600 µm thick which is thinned down by grinding and CMP to about 100 µm (50-200 µm) after bonding to the carrier 902. Alternatively, a thin glass wafer (50-200 µm) can be used to bond to the carrier.

Via holes 904, with diameter 50-100 µm, are made (e.g. by dry or wet etching) in the glass wafer 900, either down to a predetermined depth, i.e. stopping within the glass (blind via, as shown in the figure) or through the entire thickness of the glass, using the carrier 902 as stopping layer, FIG. 9a.

A seed layer, 0.01-1 µm, preferably 0.1 µm thick, (not shown) is sputtered or evaporated onto the glass wafer 900 and the vias are subsequently metallized 906 using electroplating with a mask defined by photo lithography. The metal thickness is 5-10 µm and creates a metal liner 908 in the via (not filled).

As shown in FIG. 9b, a base wafer 910 with an active component 912 also has an electroplated metal layer 913 similar to the glass via wafer 900. The metal layer forms a sealing ring 914 which creates the main bonding/joining structure for the wafers. The metal layer also provides the electrical connection between the wafers. The two metal layers (Au—Au, Cu—Cu or combinations thereof) also create spacing 915 between the wafers, when subsequently joined together, thereby forming a cavity 916 which in most cases is enough to accommodate the active components 912. A cavity could also be etched into either wafer 900, 910 in order to accommodate larger structures or improve vacuum performance.

Wafers are aligned and bonded using thermo compression bonding, see FIG. 9c-d.

The component (base) wafer 910 is a glass wafer thicker than 300 µm, i.e. thick enough to handle without carrier.

The silicon carrier 902 is removed from the via wafer 900 after bonding by grinding and etching, FIG. 9e. The component wafer 910 will thereby provide the mechanical stability to enable handling without support.

The glass is etched to reveal the Vias.

A seed layer is sputtered and pads 918 and RDL (redistribution layers) are formed by electroplating 3-5 µm Au, giving the final structure shown in FIG. 9e.

Optionally a final grinding/thinning step could be applied to thin down also the wafer 910 to 100-200 µm range for certain applications requiring low chip heights.

In an alternative embodiment the via holes 904 are made as in FIG. 9a, using a temporary carrier 902, but then a carrier 902 is attached to the opposite side from where the vi holes were made, see FIG. 9c'. Contact pads and routing structures are made, see FIG. 9d'. A component wafer 910 is bonded to the structure from FIG. 9d' and after removing the carrier 902 the final structure shown in FIG. 9e' is obtained.

The wafers are diced to singulate multiple single components out from the wafers.

The invention claimed is:

1. A method of making a micro-device with a capping structure, comprising:
   providing a base substrate on which there is a microelectronic and/or micro-mechanic component attached or integrated;
   providing a cap substrate of a glass material that exhibits a glass transition when heated towards the liquid state, selected from the group consisting of borofloat glasses, quartz, metallic alloys, $AlO_x$, and polymers;
   making micro-depressions in said cap substrate to a predetermined depth;
   metallizing only walls of the micro-depressions in the cap substrate;
   providing an electrical connection through the cap substrate by thinning the cap substrate on an opposite side from where the micro-depressions are made and exposing the metal in the micro-depressions;
   stopping the thinning before the metal is exposed;
   making openings to expose the metal;
   metallizing the openings to provide contact and to hermetically seal the electrical connection; and
   bonding together the base substrate and the cap substrate, such that there is an electrical contact between the component on the base substrate and the metallized micro-depressions in the cap substrate.

2. The method according to claim 1, wherein the base substrate is bonded to the cap substrate on a side of the cap substrate where the micro-depressions are made, after the metallization of the micro-depressions, but before the electrical connection through the cap substrate is made.

3. The method according to claim 1, wherein the base substrate is bonded to the cap substrate on the side opposite from where the micro-depressions are made, after the metallization of the micro-depressions, and after the electrical connection through the cap substrate is made.

4. A method of making a micro-device with a capping structure, comprising:
   providing a base substrate on which there is a microelectronic and/or micro-mechanic component attached or integrated;
   providing a cap substrate of a glass material that exhibits a glass transition when heated towards the liquid state, selected from the group consisting of borofloat glasses, quartz, metallic alloys, $AlO_x$, and polymers;
   making micro-depressions in said cap substrate to a predetermined depth by stamping or pressing a plurality of needles protruding from a support substrate, into the cap substrate under heating and pressure;
   metallizing only walls of the micro-depressions in the cap substrate;
   providing an electrical connection through the cap substrate; and
   bonding together the base substrate and the cap substrate, such that there is an electrical contact between the component on the base substrate and the metallized micro-depressions in the cap substrate.

5. The method according to claim 4, wherein the needles are removed together with the support substrate immediately after the depressions are made so as to leave holes in the cap substrate.

6. The method according to claim 4, wherein the needles are left in the cap substrate after the depressions and only the support substrate is removed so as to leave metal filled holes in the cap substrate material.

7. The method according to claim 1, wherein the base substrate, the cap substrate or both are provided with a depression that forms a cavity which accommodates the component when the substrates are bonded together.

8. The method according to claim 1, wherein the cap substrate before bonding to the carrier and before making the vias is provided with depressions for accommodating metal contacts, and wherein such metal contacts are selectively deposited on the bottom of said depression.

9. The method according to claim 8, further comprising masking the glass wafer cap substrate and etching to provide depressions; masking and electroplating the bottoms of the depressions to provide the desired metal contacts; bonding the glass wafer to a carrier wafer, and thinning down the glass.

10. A method of making a micro-device with a capping structure, comprising:

provided a base substrate on which there is a microelectronic and/or micro-mechanic component attached or integrated;

providing a cap substrate of a glass material, a non-crystalline or amorphous material and that exhibits a glass transition when heated towards the liquid state, selected from the group consisting of borofloat glasses, quartz, metallic alloys, AlOx, and polymers;

making micro-depressions in said cap substrate to a predetermined depth by stamping or pressing a plurality of needles protruding from a support substrate, into the cap substrate under heating and pressure;

wherein the needles are left in the cap substrate after the depressions and only the support substrate is removed so as to leave metal filled holes in the cap substrate material;

providing electrical connection through the cap substrate; and bonding together the base substrate and the cap substrate, such that there is an electrical contact between the component on the base substrate and the metallized depressions in the cap substrate.

* * * * *